United States Patent
Aslin

(10) Patent No.: US 8,472,189 B2
(45) Date of Patent: Jun. 25, 2013

(54) FIREPROOF ENCLOSURE

(75) Inventor: David Charles Aslin, Langley Mill (GB)

(73) Assignee: Penny & Giles Aerospace Ltd., Dorset (GB)

( * ) Notice: Subject to any disclaimer, the term of this patent is extended or adjusted under 35 U.S.C. 154(b) by 684 days.

(21) Appl. No.: 12/301,612

(22) PCT Filed: Apr. 11, 2007

(86) PCT No.: PCT/GB2007/001345
§ 371 (c)(1),
(2), (4) Date: Jun. 26, 2009

(87) PCT Pub. No.: WO2007/135355
PCT Pub. Date: Nov. 29, 2007

(65) Prior Publication Data
US 2009/0303671 A1 Dec. 10, 2009

(30) Foreign Application Priority Data
May 20, 2006 (GB) .................................. 0610131.5

(51) Int. Cl.
*H05K 7/20* (2006.01)
(52) U.S. Cl.
USPC ........... 361/704; 361/700; 361/701; 361/702; 361/703; 361/730; 361/752; 361/796
(58) Field of Classification Search
USPC .......................... 361/700–704, 730, 752, 796
See application file for complete search history.

(56) References Cited

U.S. PATENT DOCUMENTS

| 4,632,865 | A | * | 12/1986 | Tzur | 428/304.4 |
| 5,011,880 | A | * | 4/1991 | Cornibert et al. | 524/371 |
| 5,132,491 | A | * | 7/1992 | Mulrooney et al. | 174/36 |
| 5,438,162 | A | * | 8/1995 | Thompson et al. | 174/524 |
| 5,932,839 | A | | 8/1999 | Ren et al. | |
| 6,143,978 | A | | 11/2000 | Ren et al. | |
| 6,158,833 | A | * | 12/2000 | Engler | 312/409 |
| 6,259,019 | B1 | * | 7/2001 | Damilo et al. | 174/36 |
| 6,615,906 | B1 | * | 9/2003 | Fieback et al. | 165/10 |
| 6,638,444 | B2 | | 10/2003 | Hayes | |
| 6,793,844 | B2 | | 9/2004 | Hayes | |
| 7,788,868 | B2 | * | 9/2010 | Pollack | 52/302.1 |
| 2002/0100894 | A1 | | 8/2002 | Hayes | |
| 2005/0185366 | A1 | * | 8/2005 | Hanan et al. | 361/679 |

FOREIGN PATENT DOCUMENTS

| EP | 0715670 B1 | 11/1997 |
| EP | 1029430 B1 | 5/2005 |
| GB | 1498177 | 1/1978 |
| GB | 2409812 A * | 7/2005 |
| JP | 05146034 A * | 6/1993 |
| WO | WO2005/081983 A | 9/2005 |

OTHER PUBLICATIONS

PCT/GB2007/001345; Filed Apr. 11, 2007; International Search Report; Completed Sep. 27, 2007; 3 pp.

(Continued)

*Primary Examiner* — Hung S Bui
*Assistant Examiner* — James Wu
(74) *Attorney, Agent, or Firm* — Wells St. John P.S.

(57) ABSTRACT

An enclosure comprises a thermal barrier (42) for protecting a heat sensitive component (40). The thermal barrier includes at least one endothermic layer (48, 54, 58) that includes water gelled with a thickening agent, absorbed onto a cellulose-comprising fabric or paper. The endothermic layer is sandwiched between layers comprising metal foil or sheet (49, 52, 56).

27 Claims, 4 Drawing Sheets

OTHER PUBLICATIONS

PCT/GB2007/001345; Filed Apr. 11, 2007; International Preliminary Report; Mailed Dec. 4, 2008; 2 pp.

PCT/GB2007/001345; Filed Apr. 11, 2007; Written Opinion; Mailed Dec. 4, 2008; 5 pp.

* cited by examiner

FIREPROOF ENCLOSURE

CROSS REFERENCE TO RELATED APPLICATION

This application is a 35 U.S.C. §371 of and claims priority to PCT International Application No. PCT/GB2007/001345 which was filed on 11 Apr. 2007 (11.4.2007), and was published in English, and claims priority to GB Patent Application No.0610131.5, which was filed on 20 May 2006 (20.05.2006), the teachings of which are incorporated herein by reference.

The invention concerns providing fire protection to an enclosure and more particularly an enclosure for an aircraft "black box" data recorder.

Usually, two "black box" data recorders are fitted to commercial and to many military aircraft, in order to monitor cockpit sounds (cockpit voice recorder) and information about the flight conditions (flight data recorder). These are required to survive significant damage to or even loss of the airframe. Fire is one of the major hazards concerning survivability of the data and data recording modules, which in modern data recorders are semiconductor memory devices, and given the fuel loads carried by aircraft this can be a severe hazard. Stringent crash survivability standards are required of data recording modules, which includes testing against models of the fire hazard to which they may be subject. These take the form of high temperature tests with flames generated by an arrangement of oil or gas fired burners.

However, fire and heat exposure are not the only events to which an aircraft data recorder may be exposed. Other hazards include deep water immersion, impact shock, spike penetration, crush, fluid contamination and severe ambient temperature variation. In order to survive these conditions a data recorder is generally constructed as a series of one or more concentric compartments, as shown in FIG. 1, which may be cylindrical or rectangular in section, with the data recording modules installed in the innermost compartment. The contents of each successive compartment serve a different function and provide successive levels of protection to the data recording modules.

The sequential compartments jointly protect the data recording modules from mechanical damage, moisture, liquid ingress, shock, thermal cycling and heat. An impact resistant casing (typically enclosure 16 in FIG. 1) protects the inner compartments, which are never directly exposed to fire. However, by the nature of its mass and therefore its thermal storage capacity, the impact resistant casing when exposed to fire will absorb heat and release stored heat outwards but also inwards towards the data recording modules.

Conventionally, one or more of the inner compartments contains materials that respond endothermically to the input of heat, absorbing the heat by either decomposition or phase change. Such materials are discussed at length by Hayes in U.S. Pat. Nos. 6,638,444 and 6,793,844. Similar endothermic heat absorbers were also disclosed by Towner in GB 1,498,177 for use in aircraft data recorders and have been used extensively in fire protected safes.

The material conventionally, and according to Hayes preferentially, used as an endothermic heat absorber is boric acid. This has several practical difficulties. Boric acid is a soft powder and needs to be formed, possibly with other materials to provide a retaining matrix, in order to achieve a means of enclosing the data recording modules and facilitating mechanical assembly. While boric acid has a very high overall heat absorbing capacity the endothermic reactions occur at three distinct temperatures. When boric acid is used as an endothermic fire barrier in part of an enclosure that is subjected to heat, the thermal response of the enclosure shows three plateaux. A minor plateau at about 100° C., a more protracted plateau at 169° C. and a further minor plateau around 300° C. This is significantly above the temperature at which many types of electronic memory and other components cease to function or retain data. Further, at the reaction temperature of 169° C. the boric acid becomes molten and is no longer able to provide mechanical support to maintain the separation of enclosures in order to avoid conductive heat transfer at any point of contact.

Other endothermic materials that may be of use in the thermal protection of fight data recorders or similar enclosures, (including hydrated salts as suggested in U.S. Pat. Nos. 6,638,444 and 6,793,844), suffer from similar defects. All such materials, except for those that are only phase change materials, rely on a dehydration where the energy absorbed is due to the release of water from the material. The water is clearly released as steam. Steam is an excellent heat transfer medium so it follows that once the steam is released the entire compartment is raised to that temperature. The residual materials offer little in the way of insulation or physical support. Thus, as soon as the materials are exhausted, having released all their water, the compartment effectively loses its entire function and an immediate temperature rise is observed at the point of failure.

Boric acid decomposes thus:—

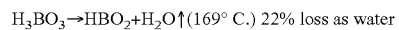

Hydrated calcium carbonate hexahydrate decomposes thus:—

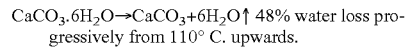

It is an aim of the present invention to provide an enclosure for housing a heat sensitive component that alleviates the aforementioned problems.

According to the present invention there is provided an enclosure as defined in claim 1.

In embodiments of the invention the enclosure comprises a thermal barrier that includes at least one endothermic layer comprising water gelled with a thickening agent, absorbed onto a cellulose-comprising fabric or paper with the endothermic layer being sandwiched between layers comprising metal foil or sheet.

The thermal barrier may be made up of successive alternating endothermic layers and metal foil/sheet layers. Alternatively, the thermal barrier may be made up of a continuous wound composite of metal foil and endothermic layers.

The enclosure may further comprise an outer casing. A further insulating or endothermic layer may surround the thermal barrier. Alternatively, or additionally, a further insulating or endothermic layer may be provided between the thermal barrier and the heat sensitive component.

The thickening agent may comprise polyethylene oxides. The thickening agent may be cross linked sodium polyacrylates.

The heat sensitive components may be electronic memory modules. The enclosure may be comprised in a flight data recorder.

Embodiments of the invention will now be described with reference to the following accompanying drawings.

Figure 1:
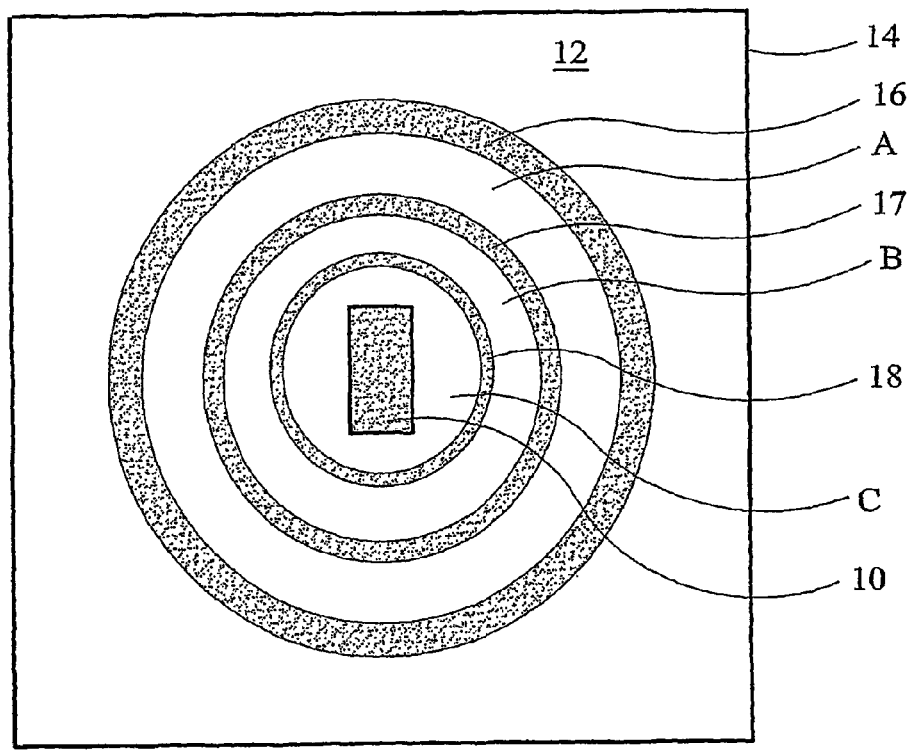
FIG. 1 is a schematic illustration of a cross-section through an enclosure typical of known enclosures for housing a data recording module.

Referring to FIG. 1, a data recording module 10 is contained inside an enclosure 12, which includes an outer casing 14, and a series of progressively smaller inner enclosures 16, 17, 18. These define a series of compartments A, B, C surrounding the data recording module 10, which is located inside the innermost compartment C. The outer casing 14 is shown as a rectangular cross-section indicative of a box-shaped container, whereas the compartments A, B, C are shown having a circular cross-section. The actual geometry of the enclosures and compartments is not important to the principles employed and may be chosen to suit the shape of the data recording module being enclosed.

Electronics to process and manage the data to be recorded may be contained between the outer casing 14 and the outermost of the inner enclosures 16. Under hazard conditions this area is entirely sacrificial although it obviously provides a degree of protection to the data recording module 10. The sequential inner compartments A, B, C, protect the data recording module 10 from mechanical damage, moisture, liquid ingress, shock, thermal cycling and heat. An impact resistant casing (typically inner enclosure 16 in FIG. 1) protects the inner compartments A, B, C, which are never directly exposed to fire. However, by the nature of its mass and therefore its thermal storage capacity, the inner enclosure 16, when exposed to fire, will absorb heat and release stored heat outwards but also inwards towards the data recording module 10.

Conventionally, and as described above, one or more of the inner compartments contains materials that respond endothermically to the input of heat, absorbing the heat by either decomposition or phase change.

A major feature of the present invention is the use of a combination of radiant barriers with more efficient endothermic heat absorption media. The principle of a radiant barrier as a means of fire protection is well known. If successive laminars of low emmisivity materials are erected with a gap between them, then the only heat transfer that can take place, laminar to laminar, is by radiation. If the laminar has an emmisivity of, say, 0.1 and it is heated by radiation from one side then the cold side of that laminar can only emit 10% of the energy incident upon it. If a second similar laminar is placed in series with the first then it follows that the second laminar can only emit 1% of the energy incident on the first laminar.

The first practical difficulty with a design embodying this principle is that low emissivity materials are usually polished metallic surfaces. However, metallic oxides have a high emissivity so that any metal that protects itself by the formation of a metal oxide layer or oxidises when heated, is unsuitable. Noble metals such as gold and platinum that do not protect their surface by oxide films are excellent in this respect. Silver exhibits this property but is subject to tarnish. The protective oxide films that appear on aluminium are very thin and are largely transparent to short wave length infrared radiation, so that aluminium, protected from further oxidation, acts as a reasonable radiation barrier up to its melting point.

Further, to be effective the laminars must not significantly touch each other or they will provide a conductive path. Normally such a system is only effective when erected vertically or where thick layers of a separating material such as silica wool are placed between the aluminium sheets as described in EP0715670B1.

Figure 2:
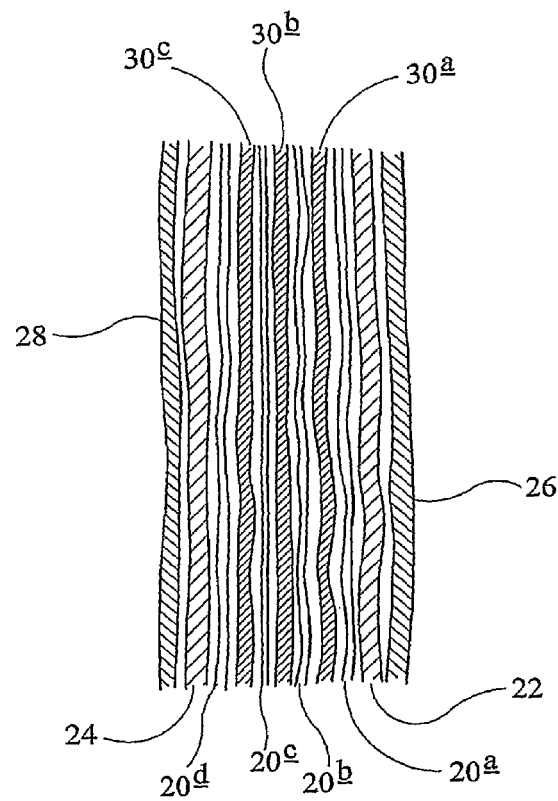
FIG. 2 is a schematic illustration of a partial cross-section through a known fire barrier.

These problems were addressed in GB 2409812 to produce a flexible fire barrier as illustrated in FIG. 2. A series of aluminium foil sheets 20a-d act as the radiant heat barriers. In order to extend the life of the aluminium sheets 20a-d they were encapsulated between protective flexible layers 22, 24 containing exfoliable graphite. In turn, these were further protected by non flammable textile skins 26, 28 such that, when exposed to fire, the surface of the first aluminium foil sheet 20a was maintained below its melting point for as long as possible. The aluminium foil sheets 20a-d were separated by layers 30a-c of ashless paper onto which was absorbed water containing small quantities of a gelling or thickening agent with the edges sealed to prevent water loss. Thus, the sequence of aluminium foil sheet radiant barriers 20a-d separated by wet paper layers 30a-c formed an endothermic and radiant core to the fire barriers. The entire structure was intended to be hung vertically to act as a compartmentalisation barrier.

Figure 3:
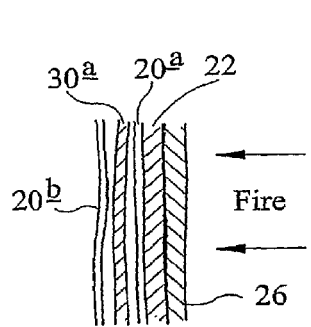
FIGS. 3a to 3c show stages in the operation of the barrier of FIG. 2 when exposed to a fire.
Figure 3:
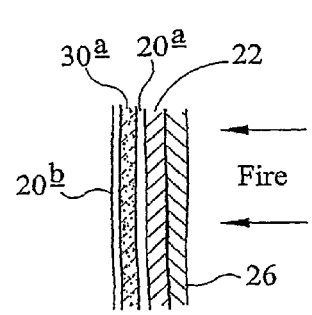
Figure 3:
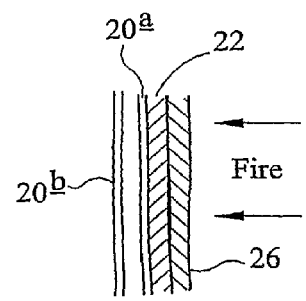

The mode of action of the structure when exposed to heat is shown in FIGS. 3a-c. In FIG. 3a, the front exfoliable graphite layer 22, when exposed to heat from a flame, expands to form an insulating mass, maintaining the temperature of the front most aluminium sheet 20a below its melting point for as long as possible. In FIG. 3b, the water entrapped as a gel on the wet paper layer 30a between the first and second aluminium sheets 20a, 20b is lost as steam, endothermically absorbing heat and separating the aluminium sheets. At this point the space between the aluminium sheets is filled only with water vapour. In FIG. 3c, as the temperature rises the ashless paper will anaerobically pyrolise to carbon. As paper is essentially cellulose the anaerobic decomposition may be represented as:—

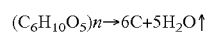

$$(C_6H_{10}O_5)n \rightarrow 6C + 5H_2O\uparrow$$

The residual carbon from the paper then forms a fine network of carbon as a skeleton of the original paper and serves to separate the aluminium foils causing them to act as radiation barriers. This procedure repeats itself layer by layer for as many layers of aluminium foil/wet paper sandwich as are present. Once all the water is lost the dried foil and carbon stack acts as a multiple radiation barrier. Eventually if the heat is very intense and exposure is long enough the heat from the activating fire regime will cause the aluminium foils to melt and burn through.

This system is designed to operate in a vertical plane without a heat sink and free to expand horizontally. These properties made it unsuitable for use in protecting heat sensitive components that would need to work within the confined compartments of a flight data recorder and without the exfoliable graphite outer layer. Nevertheless, the present invention seeks to make use of the excellent fire protection performance of the multiple radiation barrier and endothermic layer sandwich by configuring the materials in such a way that they can work effectively within the confined compartments of a flight data recorder.

Figure 4:
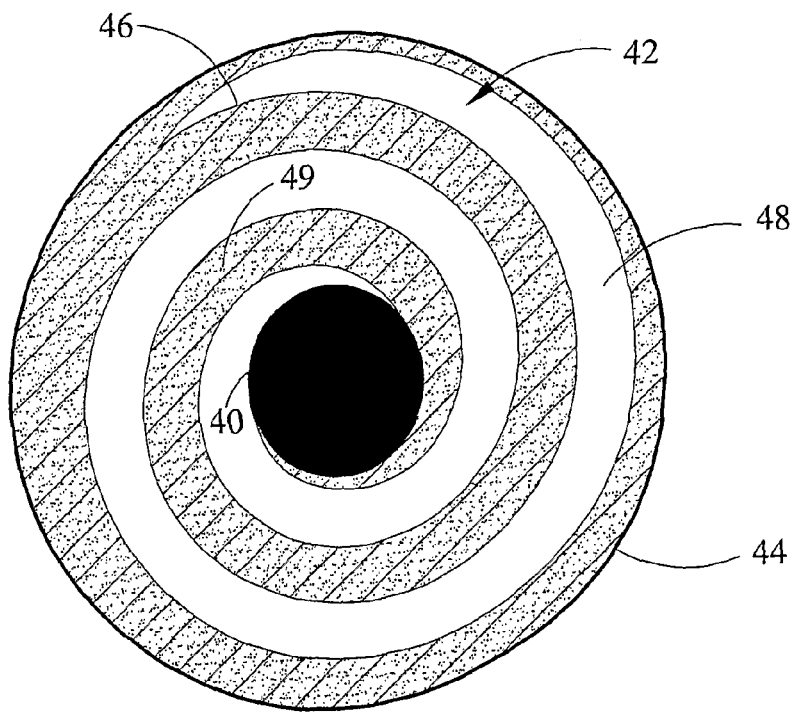
FIG. 4 is a schematic view of a cross-section through one embodiment of an enclosure according to the present invention.
Figure 5:
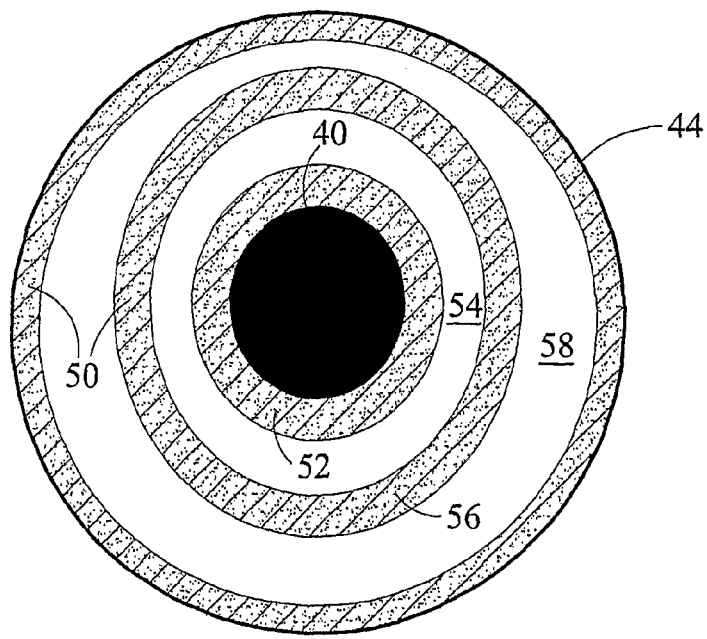
FIG. 5 is a schematic view of a cross-section through another embodiment of an enclosure according to the present invention.

In embodiments of the invention, the enclosures are configured as shown in FIGS. 4 and 5. In each case a heat sensitive component 40 is surrounded by an enclosure that includes a thermal barrier 42 housed within an outer casing 44. The thermal barrier fills the compartment between the heat-sensitive component 40 and the outer casing 44 and includes an endothermic radiant fire barrier, abbreviated to ERFB, as described below.

In FIG. 4 the enclosure includes a spiral wound ERFB 46. This comprises a continuous layer of endothermic wetted paper 48 and a continuous layer of aluminium foil 49. The ERFB 46 may be produced by taking a single long sheet of aluminium foil and placing over it a single long sheet of absorbent paper soaked in gelled water, before then winding the paper and aluminium foil composite ERFB 46 around a central tube that contains the heat sensitive component 40. In this way the single wound ERFB 46 takes the form of a multiple-layered ERFB because heat will have to pass through the layers of the ERFB several times to reach the heat sensitive component 40.

In FIG. 5 the enclosure includes a concentric wound ERFB 50. This may be produced by first wrapping the heat sensitive component 40 (or a tube housing the component) in aluminium foil such that an overlap is formed and the component/tube is entirely covered in a first layer of aluminium foil 52. Next, a sheet of absorbent paper wetted with gelled water may be wrapped over the aluminium foil, again to the point where an overlap is created to ensure that the component is entirely surrounded by a first endothermic layer 54. A further sheet of aluminium foil may then be wrapped over this endothermic layer 54 to form a second layer of aluminium foil 56. A second endothermic layer 58 of gelled water wetted paper may then be wrapped over this in the same manner as the first. The layers are then built up to as many as needed to fill the space between the component/tube 40 and the outer casing 44.

Specimen enclosures were constructed to test the thermal barriers constructed in the manner described above. A simple inner tube was used in place of the heat sensitive component 40. A thermocouple was attached to the inner tube in each specimen enclosure so as to monitor the temperature rise of the inner tube during testing of the enclosure. The inner tube was surrounded by a thermal barrier of a different construction for each of the samples tested, and the thermal barrier was surrounded by an outer casing. The volume between the inner tube and the outer casing was the same for each specimen enclosure. The specimen enclosures were tested by exposing them to heat from ceramic heaters, which were operated at a constant temperature of 700° C. The results are shown below in table 1.

Four different specimens were tested. Specimen 1A was a control specimen with the thermal barrier contained boric acid. Specimen 1B was another control specimen, the thermal barrier containing magnesium oxychloride, which is a well-known endothermic material with an extensive history of use in fire protection systems in safe boxes and other applications and is referred to as sorrel cement. Specimen 1C contained a spiral wound thermal barrier as described above and shown in FIG. 4. Specimen 1D contained a concentric thermal barrier as described above and shown in FIG. 5.

TABLE 1

| Internal Thermocouple Temperature | Specimen 1A Boric acid Secs to temp | Specimen 1B Sorrel Cement Secs to temp | Specimen 1C ERFB Spiral wound 8 layers Secs to temp | Specimen 1D ERFB concentric wound, 8 layers Secs to temp |
|---|---|---|---|---|
| 100° C. | 100 | 120 | 930 | 1,410 |
| 125° C. | 165 | 610 | 1,070 | 1,500 |
| 150° C. | 280 | 685 | 1,130 | 1,530 |
| 175° C. | 770 | 740 | 1,170 | 1,560 |
| 200° C. | 850 | 790 | 1,200 | 1,580 |
| 225° C. | 900 | 820 | 1,220 | 1,600 |
| 250° C. | 920 | 850 | 1,240 | 1,630 |
| Stability at 250° C. | Collapsed | Stable | Stable | Stable |

Clearly the endothermic radiant fire barriers of Specimens 1C and 1D were significantly more effective in preventing the temperature rise of the inner core than the control samples 1A and 1B, for the same volume of fill.

The performances of the two control specimens 1A and 1B were considered with respect to their ability to protect electronic enclosures and the contents of those enclosures. An equivalent volume of boric acid exceeds the performance of a standard endothermic material such as sorrel cement by providing up to 10% greater protection time at higher temperatures (175° C. and above). However, conventional memory chips and other electronic components with a limited temperature resistance, would be efficiently protected for almost 6 times as long by a simple endotherm, such as hydrated calcium carbonate or Sorrel Cement, that has a lower water release plateau if the target temperature were no more than 125° C. Thus, while boric acid is a known and proven endothermic barrier of flight recorder modules it has little value at lower target temperatures or in protecting other enclosures of safety critical electronic equipment against the effect of fire and heat.

Clearly the endothermic radiant fire barrier exceeds the performance of either of the control specimens by a significant amount.

As indicated above, it is advantageous for the thermal barrier to maintain a physical support for the heat sensitive components even after any endothermic decomposition has taken place. This consideration also applies to other types of enclosure that may contain hydraulic or pneumatic actuators that need to continue functioning even in a fire situation and require mechanical support. Endothermic barriers such as boric acid or mixtures of boric acid that will melt on decomposition, cannot act as supports after they have reached this melting phase. The endothermic radiant fire barriers provide this property.

An alternative method of constructing the concentric arrangement shown in FIG. 5 is to provide a series of different sized thin-walled tubular enclosures (e.g. aluminium metal tubes of different diameters). Starting with the smallest tube, each tube can be surrounded with layers of absorbent paper wetted with gelled water, before being inserted into the next, larger tube. In this way the complete enclosure can be built up in the manner of a Russian doll.

For further trials, specimens of the component parts of a data recorder box were assembled using the endothermic radiant fire barrier in various configurations. The specimens were constructed generally in accordance with the arrangement depicted in FIG. 1, with various combinations of materials/fire barrier constructions used in each of voids A and B, as summarized in table 2. These specimens were then mounted 300 mm in front of a forced air methane burner generating 350 kW. The burner was fired and the thermal response recorded from a thermocouple that was mounted in the position of the data recording module 10. Table 2 indicates the times taken for the thermocouple temperature to reach 150° C. and 180° C.

TABLE 2

| Example | Void A | Void B | Time to 150° C. Minutes | Time to 180° C. Minutes |
|---|---|---|---|---|
| 2A | Microporous silica | Boric acid | 25.50 | 27.00 |
| 2B | Spiral wound ERFB | Spiral wound ERFB | 38.50 | 38.75 |
| 2C | Microporous silica | Spiral wound ERFB | 49.00 | 50.50 |
| 2D | Microporous silica | Sorrel cement | 38.00 | 42.00 |
| 2E | Sorrel cement | Spiral wound ERFB | 55.00 | 62.00 |

Example 2B had a total of 31 layers occupying the voids. Example 2C & 2E had 24 wraps occupying void B.

It should be noted that in example 2B where the sole fire protection was by the endothermic radiant fire barrier, when the barrier was exposed to temperatures on the outer skin exceeding the melting point of the aluminium, the system failed due to burn-through of the aluminium foil. However, when the endothermic radiant fire barrier was itself protected as in the original embodiment, GB 2409812, where the systems act synergistically, the performance is significantly improved.

While the test conditions were significantly more severe than the Aviation Authorities requirement for data recorder boxes and more akin to a hydrocarbon jet fire test, the results show that the endothermic radiant fire barrier system exceeds the performance of either boric acid or conventional water releasing endotherms. Where it is used in conjunction with other insulating or endothermic fire protection, performance can be further improved.

It is clearly indicated from the foregoing results that the endothermic radiant fire barrier provides full mechanical support after the water is exhausted. Further, because the space surrounding any inner chamber is effectively full of highly thixotropic material separated by impervious barriers these will act as shock absorbers and protect the inner components from damage by vibration and shock. While in the spiral wound case it could be argued that there is one continuous compartment this system is clearly acting to compartmentalise the structure at any point. In any radial direction, heat must pass through multiple layers of the thermal barrier.

The following indicates preferred and some alternative materials that may be used for the endothermic radiant fire barrier.

(a) The metal foil may be any flexible foil that lends itself to rolling as described and may be any thickness from 1 to 200 microns but 30 microns is preferred. A foil largely of aluminium is preferred, but gold, silver or other metal foil may be used.

(b) The paper or non-woven fabric may be any absorbent material that is primarily cellulosic but preferably a paper essentially free from ash or clays and with a thickness of 0.05 to 0.3 mm. A woven fabric that is essentially cellulose (e.g. cotton) may also be used subject to having adequate absorbency.

(c) The water may be gelled with any thickening agent selected from vegetable thickening agents such as cornflower, arrowroot or agar, methyl or ethyl cellulose, polyethylene oxides, or cross linked sodium polyacrylates. The material should be chosen such that a stiff gel is obtained sufficient to allow the gel to remain in place while assembling the endothermic radiant fire barrier, but to have as low a concentration as possible. For example a 0.5% solution of BASF superabsorbent polymer E1654/01 is illustrative (but not necessary definitive) of the gel structure required.

The loading of water on the paper may be achieved as follows. Absorbent paper will have a bulk specific gravity (SG) of approximately 0.025. If fully saturated with gelled water the thickness of the paper will not significantly increase but will absorb 0.975 grams of water per 0.025 grams of paper. If absorbent paper 0.15 mm thick is fully loaded with gelled water and interleaved with standard 30 micron aluminium foil this will have an SG of 1.03 and a water content of 92%. However, in an enclosure protected by an endotherm contained in an adjacent cavity it is the weight of water that can be emitted from a fixed volume that provides the fire protection. The theoretical calculation for the properties of the endothermic radiant fire barrier is shown below as Example 3 in Table 3 which illustrates the advantages of the present invention.

TABLE 3

| | Boric Acid | Calcium Carbonate | Sorrel Cement | ERFB Example 3 |
|---|---|---|---|---|
| SG | 1.44 | 1.77 | 1.58 | 1.03 |
| Water release % | 56 | 48 | 51 | 92 |
| grams of water released per cm$^3$ | 0.81 | 0.85 | 0.81 | 0.95 |
| Release temp ° C. | 169/306 | 100 | 100 | 100 |

Figure 6:
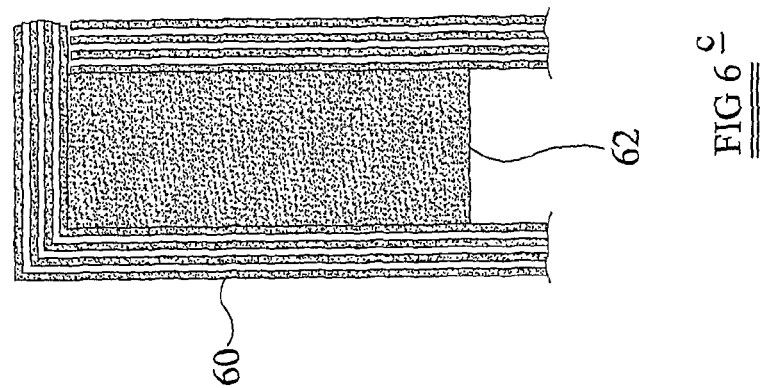
FIGS. 6a-6c illustrate a procedure of providing fire protection on faces of an enclosure according to one embodiment.
Figure 6:
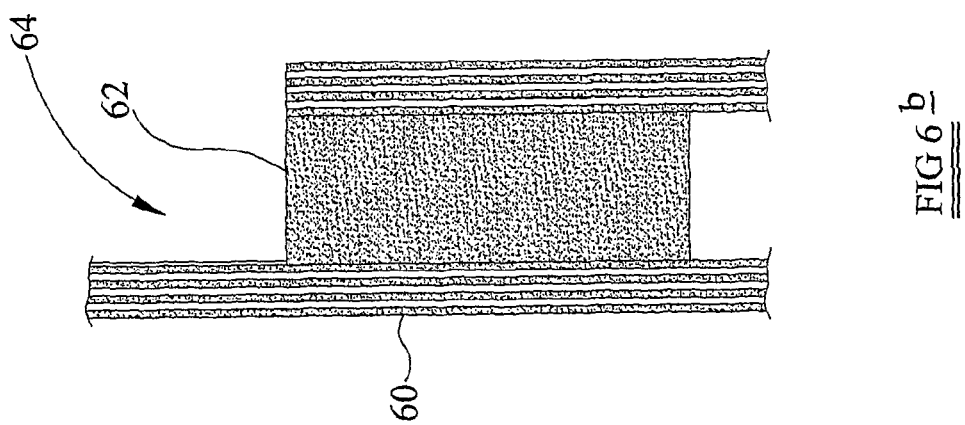
Figure 6:
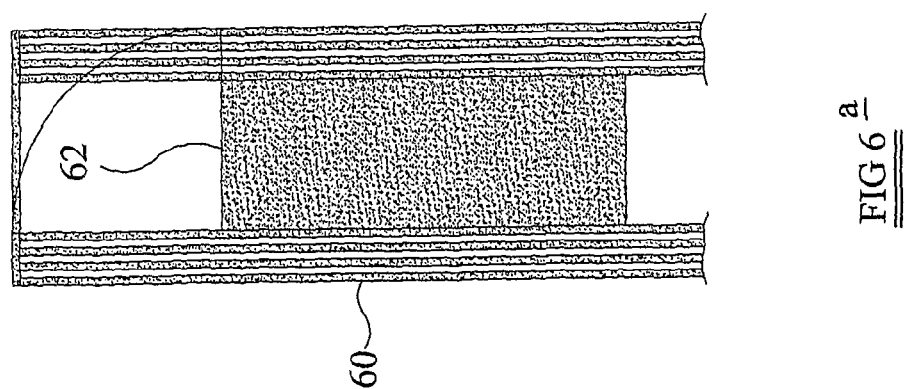

The fire protection will be required to be present on all faces of the enclosure, for example a cylindrical or rectangular enclosure. Obviously the same degree of fire protection will be required on the end faces as the rest of the enclosure. This may easily be achieved by a procedure illustrated in FIGS. 6a to 6c. First, as shown in FIG. 6a a spiral or concentric wrap of ERFB 60 is created, which is longer than an inner enclosure 62, which houses the heat sensitive component. As shown in FIG. 6b, a portion 64 of the ERFB 60, which extends beyond the inner enclosure 62 is removed. The remaining ERFB may be folded over the ends of the enclosure as shown in FIG. 6c. The wrapped enclosure may then be packed inside a further, outer enclosure.

To prevent the gel from drying out during the life of the product, there is a need to seal the chamber containing the endothermic radiant fire barrier. This may be achieved by any suitable means such as using a flexible elastomer, a polyurethane adhesive or an end plate with an O-ring.

Although this specification describes the use of the endothermic radiant fire barrier in a flight data recorder application, it will be apparent to a skilled person that the inventive enclosure can be applied to many other similar applications.

The invention claimed is:

1. An enclosure comprising a casing forming a compartment surrounding a heat sensitive component, and a thermal barrier between the casing and the heat sensitive component, wherein the thermal barrier includes at least one endothermic layer comprising water gelled with a thickening agent and absorbed onto a cellulose-comprising fabric or paper and sandwiched between layers comprising metal foil or sheet, and wherein the thermal barrier is wrapped around the heat sensitive component so as to completely fill available space between the casing and the heat sensitive component and thereby provide a support for the heat-sensitive component before and after endothermic decomposition of said at least one endothermic layer.

2. The enclosure according to claim 1 wherein the thermal barrier is made up of successive alternating endothermic layers and metal foil/sheet layers.

3. The enclosure according to claim 1 wherein the thermal barrier is made up of a continuous wound composite of said metal foil and endothermic layers.

4. The enclosure according to claim 1 wherein the thickening agent comprises one of polyethylene oxides and cross-linked sodium polyacrylates.

5. An enclosure comprising a thermal barrier for protecting a heat sensitive component, wherein the thermal barrier includes at least one endothermic layer comprising water gelled with a thickening agent, absorbed onto a cellulose-comprising fabric or paper and wherein said endothermic layer is sandwiched between layers comprising metal foil or sheet, and wherein said thermal barrier is configured such that a plurality of said endothermic layers surround said heat sensitive component and the thermal barrier and the heat sensitive component completely fill said enclosure.

6. The enclosure according to claim 5 wherein the thermal barrier is made up of successive alternating endothermic layers and metal foil/sheet layers.

7. The enclosure according to claim 5 wherein the thermal barrier is made up of a continuous wound composite of layers of said metal foil and endothermic layers.

8. The enclosure according to claim 5 wherein the thickening agent comprises one of polyethylene oxides and cross-linked sodium polyacrylates.

9. The enclosure according to claim 1 wherein the thermal barrier contacts the heat sensitive component.

10. The enclosure according to claim 1 wherein the enclosure is void of any support structure of the heat sensitive component apart from the thermal barrier and the casing.

11. The enclosure according to claim 1 wherein the thermal barrier occupies substantially the same volume before and after decomposition of the thermal barrier.

12. The enclosure according to claim 1 wherein the at least one endothermic layer is configured to support the heat sensitive component after decomposition of the at least one endothermic layer.

13. The enclosure according to claim 1 wherein the thermal barrier is configured to protect the heat sensitive component from vibration and shock.

14. The enclosure according to claim 5 wherein the enclosure is void of any support structure of the heat sensitive component apart from the thermal barrier and an outer casing about the thermal barrier.

15. The enclosure according to claim 5 wherein the thermal barrier occupies substantially the same volume before and after decomposition of the thermal barrier.

16. The enclosure according to claim 5 wherein the at least one endothermic layer is configured to support the heat sensitive component after decomposition of the at least one endothermic layer.

17. The enclosure according to claim 5 wherein the thermal barrier is configured to protect the heat sensitive component from vibration and shock.

18. The enclosure according to claim 1 wherein the heat sensitive component is a memory module of a data recorder.

19. The enclosure according to claim 5 wherein the heat sensitive component is a memory module of a data recorder.

20. An enclosure comprising a casing forming a compartment surrounding a heat sensitive component, and a thermal barrier between the casing and the heat sensitive component,
wherein the thermal barrier includes at least one endothermic layer comprising water gelled with a thickening agent and absorbed onto a cellulose-comprising fabric or paper and sandwiched between layers comprising metal foil or sheet,
and wherein the thermal barrier is wrapped around the heat sensitive component so as to substantially fill the compartment and thereby provide a support for the heat-sensitive component before and after endothermic decomposition of said at least one endothermic layer, and
wherein the enclosure is void of any support structure of the heat sensitive component apart from the thermal barrier and the casing.

21. The enclosure according to claim 20 wherein the thermal barrier is made up of successive alternating endothermic layers and metal foil/sheet layers.

22. The enclosure according to claim 20 wherein the thermal barrier is made up of a continuous wound composite of said metal foil and endothermic layers.

23. The enclosure according to claim 20 wherein the thickening agent comprises one of polyethylene oxides and cross-linked sodium polyacrylates.

24. The enclosure according to claim 20 wherein the thermal barrier contacts the heat sensitive component.

25. The enclosure according to claim 20 wherein the thermal barrier occupies substantially the same volume before and after decomposition of the thermal barrier.

26. The enclosure according to claim 20 wherein the at least one endothermic layer is configured to support the heat sensitive component after decomposition of the at least one endothermic layer.

27. The enclosure according to claim 20 wherein the heat sensitive component is a memory module of a data recorder.

* * * * *